(12) United States Patent
Ro et al.

(10) Patent No.: US 7,327,556 B2
(45) Date of Patent: Feb. 5, 2008

(54) CARBON-COATED ALUMINUM AND METHOD FOR PRODUCING SAME

(75) Inventors: Akinori Ro, Osaka (JP); Zenya Ashitaka, Osaka (JP)

(73) Assignee: Toyo Aluminum Kabushiki Kaisha, Osaka (JP)

( * ) Notice: Subject to any disclaimer, the term of this patent is extended or adjusted under 35 U.S.C. 154(b) by 71 days.

(21) Appl. No.: 10/549,202

(22) PCT Filed: Mar. 11, 2004

(86) PCT No.: PCT/JP2004/003239

§ 371 (c)(1),
(2), (4) Date: Sep. 16, 2005

(87) PCT Pub. No.: WO2004/087984

PCT Pub. Date: Oct. 14, 2004

(65) Prior Publication Data

US 2006/0172134 A1   Aug. 3, 2006

(30) Foreign Application Priority Data

Mar. 31, 2003   (JP) .............................. 2003-092983

(51) Int. Cl.
*H01G 9/00*    (2006.01)
(52) U.S. Cl. ...................... 361/502; 361/503
(58) Field of Classification Search ........ 361/502–503; 428/408, 698; 427/374.2, 180
See application file for complete search history.

(56) References Cited

U.S. PATENT DOCUMENTS 5,626,963 A * 5/1997 Hirano et al. ............... 428/408
6,808,845 B1 * 10/2004 Nonaka et al. ............. 429/213

FOREIGN PATENT DOCUMENTS

| JP | 52-138440 A | 11/1977 |
| JP | 58-174567 A | 10/1983 |
| JP | 4-62820 A | 2/1992 |
| JP | 04071213 A | 3/1992 |
| JP | 2000-164466 A | 6/2000 |
| JP | 2002-60966 A | 2/2002 |
| JP | 2003-342702 A | 12/2003 |
| WO | WO-00/07253 A1 | 2/2000 |

* cited by examiner

*Primary Examiner*—Eric Thomas
(74) *Attorney, Agent, or Firm*—Birch, Stewart, Kolasch & Birch, LLP (57) ABSTRACT

Provided are an aluminum material coated with carbon which can improve the adhesion between an aluminum material and an active substance layer, and a manufacturing method thereof. The aluminum material coated with carbon includes an aluminum material (1) and a carbon-containing layer (2) formed on the surface of the aluminum material (1), and also includes an interposition layer (3) that is formed between the aluminum material (1) and the carbon-containing layer (2) and contains an aluminum element and a carbon element. The manufacturing method of an aluminum material coated with carbon includes a step of arranging an aluminum material in a space containing a hydrocarbon-containing substance and a step of heating in the state where the aluminum material is arranged in the space containing the hydrocarbon-containing substance.

20 Claims, 4 Drawing Sheets

CARBON-COATED ALUMINUM AND METHOD FOR PRODUCING SAME

TECHNICAL FIELD

This invention relates to an aluminum material coated with carbon, an electrode structure, a capacitor or a battery using the aluminum material coated with carbon, and a manufacturing method of the aluminum material coated with carbon. More particularly, this invention relates to an aluminum foil coated with carbon as an electrode material or an electrode current collector material used for a lithium battery, lithium ion battery, lithium ion polymer battery, dye-sensitive solar battery, electric double-layer capacitor, electrolytic capacitor and the like, an aluminum plate coated with carbon as an electrode material or an electrode current collector material used for a fuel cell, solid polymer fuel cell and the like, and a manufacturing method thereof.

BACKGROUND ART

There are batteries as measures taken to convert chemical energy directly to electric energy. These batteries have the ability to discharge an electric charge or to charge and discharge an electric charge repeatedly with the use of electrochemical change and are therefore used as power sources of various electric or electronic devices. Also, there are capacitors as devices having the ability to charge and discharge an electric charge repeatedly and these capacitors are used as electric element parts of various electric or electronic devices.

Lithium ion batteries and lithium ion polymer batteries, which are secondary batteries having high energy efficiency, are currently used as power sources for portable telephones, personal computers and cameras. Also, a trial is made to use a fuel cell as a power source for automobiles. As to solar batteries, dye-sensitive solar batteries which are low cost and common types are being developed as crystal-type, amorphous-type or thin film-type solar batteries in the next generation.

In fuel cells, for example, a material obtained by coating the surface of a current collector made of an aluminum plate is coated with an active substance constituted of a carbon material is used as a cathode material.

In the dye-sensitive solar batteries, a material obtained by coating the surface of a thin-film substrate with a conductive material such as carbon materials is used as an electrode material.

In an electric double layer capacitor which is one of electrochemical capacitors, on the other hand, a material obtained by coating the surface of a current collector made of an aluminum foil with an active substance made of an active carbon powder is used as a polar electrode. Specifically, a binder material, a conductive agent and the like are added to and mixed with an activated carbon powder to prepare a slurry like material, which is then applied to the surface of the aluminum foil and then dried at ambient temperature and the dried material is cut into a predetermined size to manufacture a polar electrode. There is also the case where a polar electrode is manufactured by applying a mixture of an activated carbon powder, a resin and the like onto the surface of an aluminum foil under pressure and heating.

In an electrolytic capacitor, conventionally, a conductor made of an aluminum foil having a surface area enlarged by etching has been used for a cathode material. However, capacitors in which the surface of the electrode is enlarged by adhering a carbon powder onto the surface of an aluminum foil have been developed in recent years.

As a method of manufacturing an aluminum material coated with carbon which is to be used for electrode material such as batteries and capacitors, a method in which a carbon intermediate film or an intermediate film of a metal richer than aluminum is provided on an aluminum current collector and an active substance layer such as carbon is applied to the intermediate film is disclosed in Japanese Unexamined Patent Publication No. 2000-164466. Also, WO 00/07253 discloses a current collector used to fabricate a lithium secondary battery, which is increased in surface area, improved in binding strength with an active substance layer and has excellent charging/discharging characteristics by treating an aluminum material and a copper current collector used as a current collector in a lithium secondary battery as an aqueous acidic solution, aqueous basic solution or aqueous neutral solution and, in some cases, forming a conductive polymer film.

However, even if any of the above methods is used, the resulting aluminum material coated with carbon is inferior in adhesion between the active substance layer made of a carbon-containing material and the surface of an aluminum material. For this, there is the case where the active substance layer is separated from the surface of an aluminum material when a secondary battery or a capacitor is charged or discharged. As a result, there arises a problem that, for example, the charging/discharging characteristics and life of a secondary battery or a capacitor are dropped.

In order to obtain, for example, an electric double layer capacitor having a large capacity, it is necessary to increase the contact area between a polar electrode and an electrolytic solution by forming a thick active substance layer on the surface of a current collector. However, if a conventional aluminum material coated with carbon is used to constitute an electrode, this poses a problem that the active substance layer comprising carbon-containing substance is separated from the current collector made of an aluminum material when the capacitor is charged or discharged.

DISCLOSURE OF THE INVENTION

Thus, it is an object of this invention to solve the above problems and to provide a structure of an aluminum material coated with carbon that can improve the adhesion between an aluminum material and an active substance layer and a manufacturing method thereof.

It is another object of this invention to provide an electrode structure made of an aluminum material coated with carbon that can improve the adhesion between an aluminum material and an active substance layer.

It is still another object of this invention to provide a capacitor provided with an electrode structure made of an aluminum material coated with carbon that can improve the adhesion between an aluminum material and an active substance layer.

It is yet another object of this invention to provide a battery provided with an electrode structure made of an aluminum material coated with carbon that can improve the adhesion between an aluminum material and an active substance layer.

The inventors of this invention have made earnest studies to solve the problems about the conventional art and, as a result, have found that an aluminum material coated with carbon, that can attain the above object, can be obtained by heating an aluminum material in a specific condition. This invention was made based on the findings of the inventors.

An aluminum material coated with carbon according to this invention includes an aluminum material and a carbon-containing layer formed on the surface of the aluminum material, and also includes an interposition layer that is formed between the aluminum material and the carbon-containing layer and contains an aluminum element and a carbon element.

In this aluminum material coated with carbon, the interposition layer formed between the aluminum material and the carbon-containing layer as an active substance layer exhibits the effect of improving the adhesion between the aluminum material and the active substance layer. Also, the carbon-containing layer exhibits the effect of enlarging or increasing the surface area of the aluminum material. Therefore, the interposition layer exhibits the effect of improving the adhesion between the carbon-containing layer which is an active substance layer that increases the surface area of the aluminum material and the aluminum material. An improvement in adhesion to the active substance layer and an increase in surface area can be attained in the aluminum material coated with carbon.

In the aluminum material coated with carbon according to this invention, preferably, the carbon-containing layer includes therein an interposition material containing an aluminum element and a carbon element.

When the carbon-containing layer is thin, the adhesion between the aluminum material and the active substance layer can be more improved rather than that of a conventional one by only making the above interposition layer present. However, when the carbon-containing layer is thick, there is a possibility of separation in the interior thereof. In this case, the adhesion inside the carbon-containing layer can be raised and it is therefore possible to prevent separation by forming an interposition material containing an aluminum element and a carbon element inside the carbon-containing layer.

The interposition material is preferably a compound of an aluminum element and a carbon element. Also, the carbon-containing layer is preferably a compound of an aluminum element and a carbon element.

In the aluminum material coated with carbon according to this invention, preferably, the carbon-containing layer is formed so as to extend outward from the surface of the aluminum material. In this case, the carbon-containing layer exhibits the effect of enlarging or increasing the surface area of the aluminum material more effectively.

In the aluminum material coated with carbon according to this invention, preferably, the interposition layer constitutes a first surface portion that is formed on at least a part of the surface of the aluminum material and contains a carbide of aluminum. The carbon-containing layer preferably constitutes a second surface portion that is formed so as to extend outward from the first surface portion.

In this case, the second surface portion exhibits the effect of increasing the surface area of the aluminum material. Also, since the first surface portion containing a carbide of aluminum is formed between the aluminum material and the second surface portion, this first portion exhibits the effect of increasing the adhesion to the second surface portion that increases the surface area of the aluminum material. An improvement in adhesion to the active substance layer and an increase in surface area can be thereby made more effectively in the aluminum material coated with carbon.

Also, it is preferable that the carbon-containing layer further includes carbon particles, and the second surface portion is formed between the first surface portion and the carbon particles and contains a carbide of aluminum. In this case, even if a thick carbon-containing layer is formed, the adhesion between the carbon-containing layer as an active substance layer and an aluminum material can be surely kept.

Preferably, the carbon-containing layer includes aluminum particles in addition to the carbon particles, and also includes an aluminum particle surface portion that is formed on at least a part of the surface of the aluminum particles and contains a carbide of aluminum and an aluminum particle outside portion that is formed so as to extend outward the surface of the aluminum particles from the aluminum particle surface portion and contains a carbide of aluminum. In this case, even if a thicker carbon-containing layer is formed, the adhesion in the carbon-containing layer as an active substance layer can be raised and this can prevent separation.

The carbon-containing layer includes aluminum particles in place of carbon particles, and also includes an aluminum particle surface portion that is formed on at least a part of the surface of the aluminum particles and contains a carbide of aluminum and an aluminum particle outside portion that is formed so as to extend outward the surface of the aluminum particles from the aluminum particle surface portion and contains a carbide of aluminum. The second surface portion may be formed between the first surface portion and the aluminum particles and may contain a carbide of aluminum. In this case, a carbon-containing layer having a large surface area per unit projected area as the active substance layer can be formed.

In the aluminum material coated with carbon according to this invention, preferably, a ratio of in thickness of the carbon-containing layer is within a range between 0.1 or more and 1000 or less with respect to a thickness of the aluminum material.

The aluminum material coated with carbon which has any one of the aforementioned characteristics is used to constitute an electrode structure. The electrode structure is preferably an electrode or an electrode current collector.

The above electrode structure is used to constitute a capacitor. The electrode structure can improve, for example, the charging/discharging characteristics and life of the capacitor. The capacitor is preferably either an electrochemical capacitor or an electrolytic capacitor.

Also, the above electrode structure is used to constitute a battery. This electrode structure can improve the charging/discharging characteristics and life of the battery.

A manufacturing method of an aluminum material coated with carbon according to this invention includes a step of arranging an aluminum material in a space containing a hydrocarbon-containing substance and a step of heating in the state where the aluminum material is arranged in the space containing the hydrocarbon-containing substance.

In the manufacturing method according to this invention, unlike a conventional method, it is necessary neither to provide an intermediate film nor to carry out pretreatment or it is unnecessary to carry out a series of processes such as drying and pressure bonding after applying the carbon-containing layer to secure the adhesion. Not only the surface of an aluminum material can be coated with an active substance layer including a carbon-containing layer but also an interposition layer containing an aluminum element and a carbon element can be formed between the aluminum material and the active substance layer by a simple process in which an aluminum material is arranged in a space containing a hydrocarbon-containing substance and heated. This structure makes it possible to improve the adhesion between the aluminum material and the carbon-containing layer as an active substance layer.

Also, the manufacturing method of an aluminum material according to the present invention may further includes a step of cooling and reheating the aluminum material after the step of heating in the state where the aluminum material is arranged in the space containing the hydrocarbon-containing substance, namely, an activating step.

In this case, the step of cooling and reheating the aluminum material is preferably carried out within a temperature range between 100° C. or more and less than 660° C.

In the manufacturing method of an aluminum material according to this invention, preferably, the step of arranging the aluminum material in the space containing the hydrocarbon-containing substance involves adhering at least one kind selected from the group consisting of a carbon-containing substance and an aluminum powder to the surface of the aluminum material and, then, arranging the aluminum material in the space containing the hydrocarbon-containing substance.

Specifically, in the step of arranging the aluminum material of the manufacturing method according to this invention, an aluminum material may be arranged in a space containing a hydrocarbon-containing substance after a carbon-containing substance is adhered to the surface of the aluminum material, an aluminum material may be arranged in a space containing a hydrocarbon-containing substance after an aluminum powder is adhered to the surface of the aluminum material or an aluminum material may be arranged in a space containing a hydrocarbon-containing substance after a carbon-containing substance and an aluminum powder are adhered to the surface of the aluminum material.

In the case of forming a thin carbon-containing layer, the adhesion between the aluminum foil and the active substance layer can be more improved than the case of a conventional one only in the presence of the above interposition layer only by arranging an aluminum material in a space containing a hydrocarbon-containing substance and heating. However, in the case of forming a thick carbon-containing layer, an aluminum material is preferably arranged in a space containing a hydrocarbon-containing substance after the carbon-containing substance is adhered to the surface of the aluminum material to heat the carbon-containing layer to keep the adhesion between the aluminum material and the active substance layer without fail.

When a thicker carbon-containing layer is formed, there is the possibility of separation occurs at the interior of the carbon-containing layer. In this case, after a carbon-containing substance and an aluminum powder are adhered to the surface of the aluminum material, the aluminum material is arranged in a space containing a hydrocarbon-containing substance, followed by heating to form an interposition material containing an aluminum element and a carbon element inside the carbon-containing layer, so that adhesion inside the carbon-containing layer can be raised and separation can be thereby prevented.

Moreover, in order to form the active substance layer having a large surface area per unit projected area, the aluminum material is preferably arranged in a space containing a hydrocarbon-containing substance, followed by heating, after an aluminum powder is adhered to the surface of the aluminum material. Alternatively, after the surface of the aluminum material is roughened, the aluminum material may be arranged in a space containing a hydrocarbon-containing substance and heated.

It is to be noted that when at least one kind selected from the group consisting of a carbon-containing substance and an aluminum powder is adhered to the surface of the aluminum material in the manufacturing method according to this invention, a binder may be used. The binder is preferably an organic polymer type that can be burned when heated.

In the manufacturing method according to this invention, the step of heating the aluminum material is preferably carried out within a temperature range between 450° C. or more and less than 660° C.

Also, in the manufacturing method according to this invention, the aluminum material is preferably arranged in a space containing a paraffin-type hydrocarbon or methane in the step of arranging the aluminum material in the space containing the hydrocarbon group-containing material.

As mentioned above, the aluminum material coated with carbon according to this invention ensures that the adhesion between the carbon-containing layer and the aluminum material can be more improved than a conventional case. Also, if an electrode structure is constituted by using the aluminum material coated with carbon according to this invention, for example, the charging/discharging characteristics and life of a battery or a capacitor can be improved. Furthermore, with the manufacturing method of an aluminum material coated with carbon according to this invention, not only the surface of the aluminum material can be coated with an active substance layer including a carbon-containing layer but also an interposition layer containing an aluminum element and a carbon element can be formed between the aluminum material and the active substance layer, whereby the adhesion between the carbon-containing layer and the aluminum material can be more improved than that of a conventional one by a simple process in which the aluminum material is arranged in a space containing a hydrocarbon-containing substance, followed by heating.

BEST MODE FOR CARRYING OUT THE INVENTION

Figure 1:
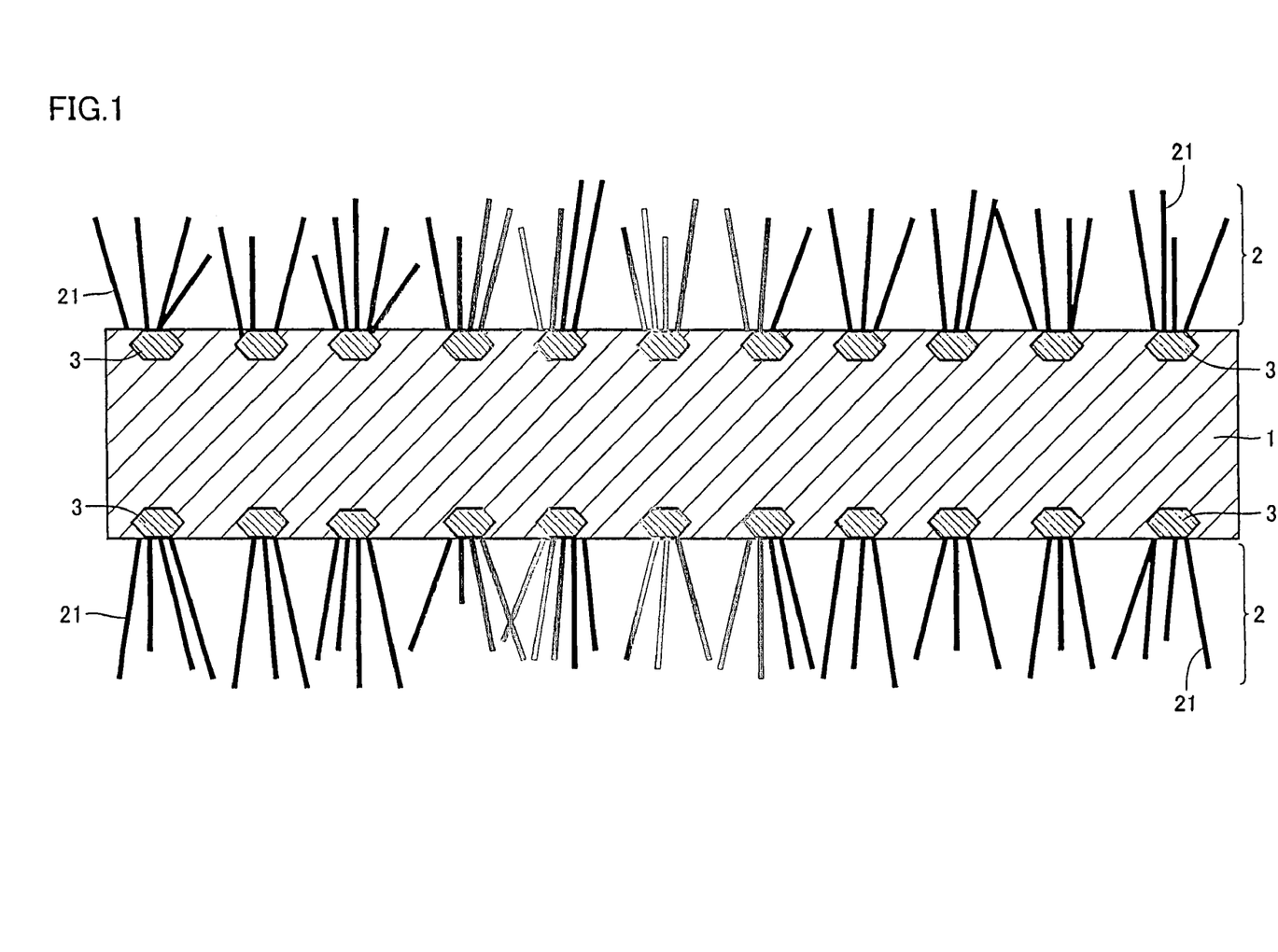
FIG. 1 is a typical view showing a sectional structure of an aluminum material coated with carbon as one embodiment of this invention.

According to the sectional structure of an aluminum material coated with carbon as one embodiment of this invention as shown in FIG. 1, a carbon-containing layer 2 is formed on the surface of an aluminum material (an aluminum plate or an aluminum foil) 1. An interposition layer 3 containing an aluminum element and a carbon element is formed between the aluminum material 1 and the carbon-containing layer 2. The carbon-containing layer 2 is formed so as to extend outward from the surface of the aluminum material 1. The interposition layer 3 constitutes a first surface portion that is formed on at least a part of the surface of the aluminum material 1 and contains a carbide of aluminum. The carbon-containing layer 2 includes a second surface portion 21 that is formed so as to extend in a fibrous form or a filament form outward from the first surface portion 3. The second surface portion 21 is a compound of an aluminum element and a carbon element.

Figure 2:
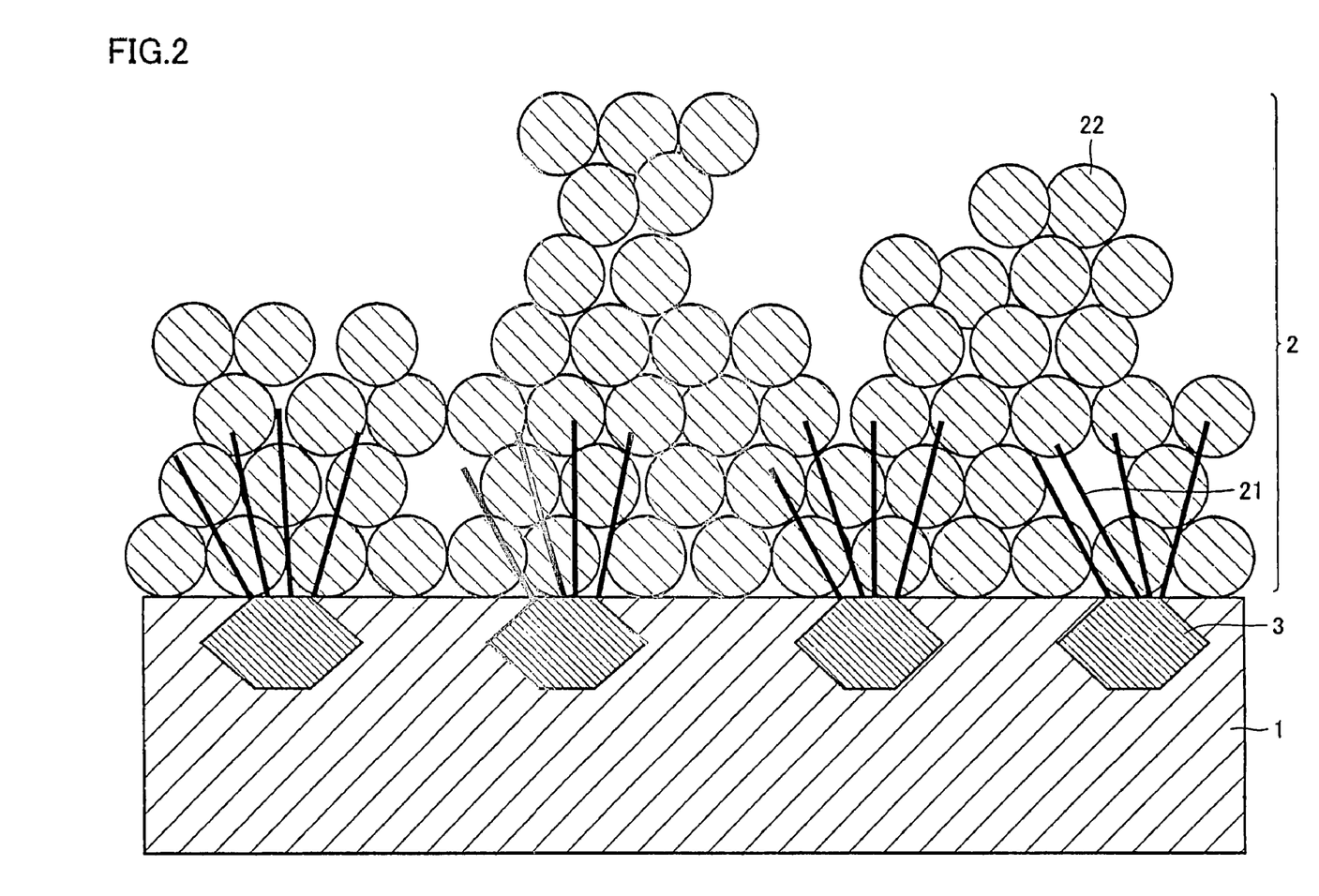
FIG. 2 is a typical view showing a sectional structure of an aluminum material coated with carbon as another embodiment of this invention.

Also, as shown in FIG. 2, the sectional structure of the aluminum material coated with carbon as another embodiment of this invention has almost the same structure as the sectional structure shown in FIG. 1, wherein the carbon-containing layer 2 further includes a large number of carbon particles 22. The second surface portion 21 extends outward in a fibrous form or a filament form from the first surface portion 3, is formed between the first surface portion 3 and the carbon particles 22 and contains a carbide of aluminum.

Figure 3:
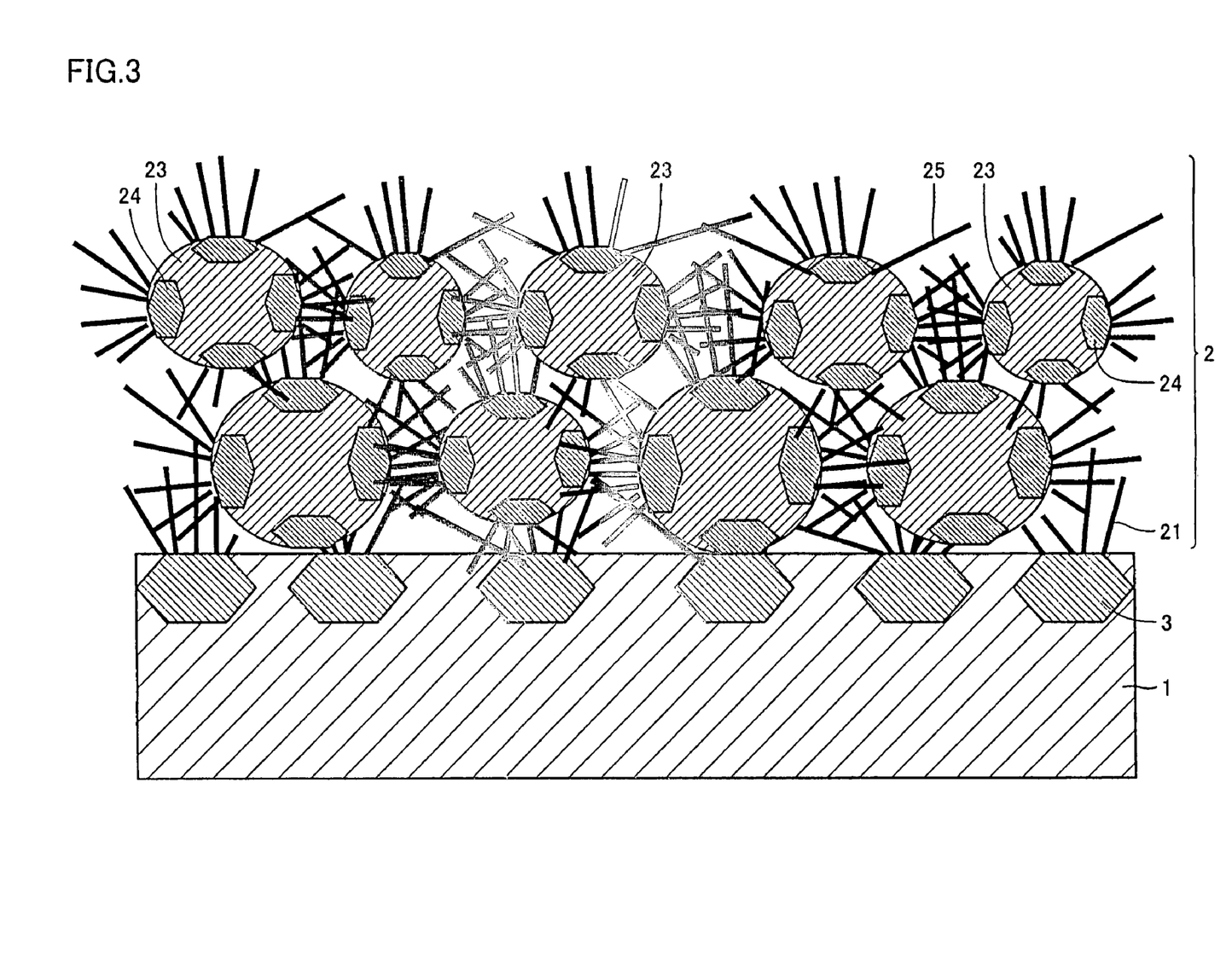
FIG. 3 is a typical view showing a sectional structure of an aluminum material coated with carbon as still another embodiment of this invention.

Moreover, as shown in FIG. 3, the sectional structure of an aluminum material coated with carbon as still another embodiment of this invention has almost the same structure as the sectional structure shown in FIG. 1, wherein the carbon-containing layer 2 further includes a large number of aluminum particles 23. An aluminum particle surface portion 24 is formed on at least a part of the surface of the aluminum particles 23 and contains a carbide of aluminum. An aluminum particle outside portion 25 is formed so as to extend in a cactus form outward the surface of the aluminum particles 23 from the aluminum particle surface portion 24 and contains a carbide of aluminum. The second surface portion 21 extends in a fibrous form or a filament form outward from the first surface portion 3, is formed between the first surface portion 3 and the aluminum particles 23 and contains a carbide of aluminum.

Figure 4:
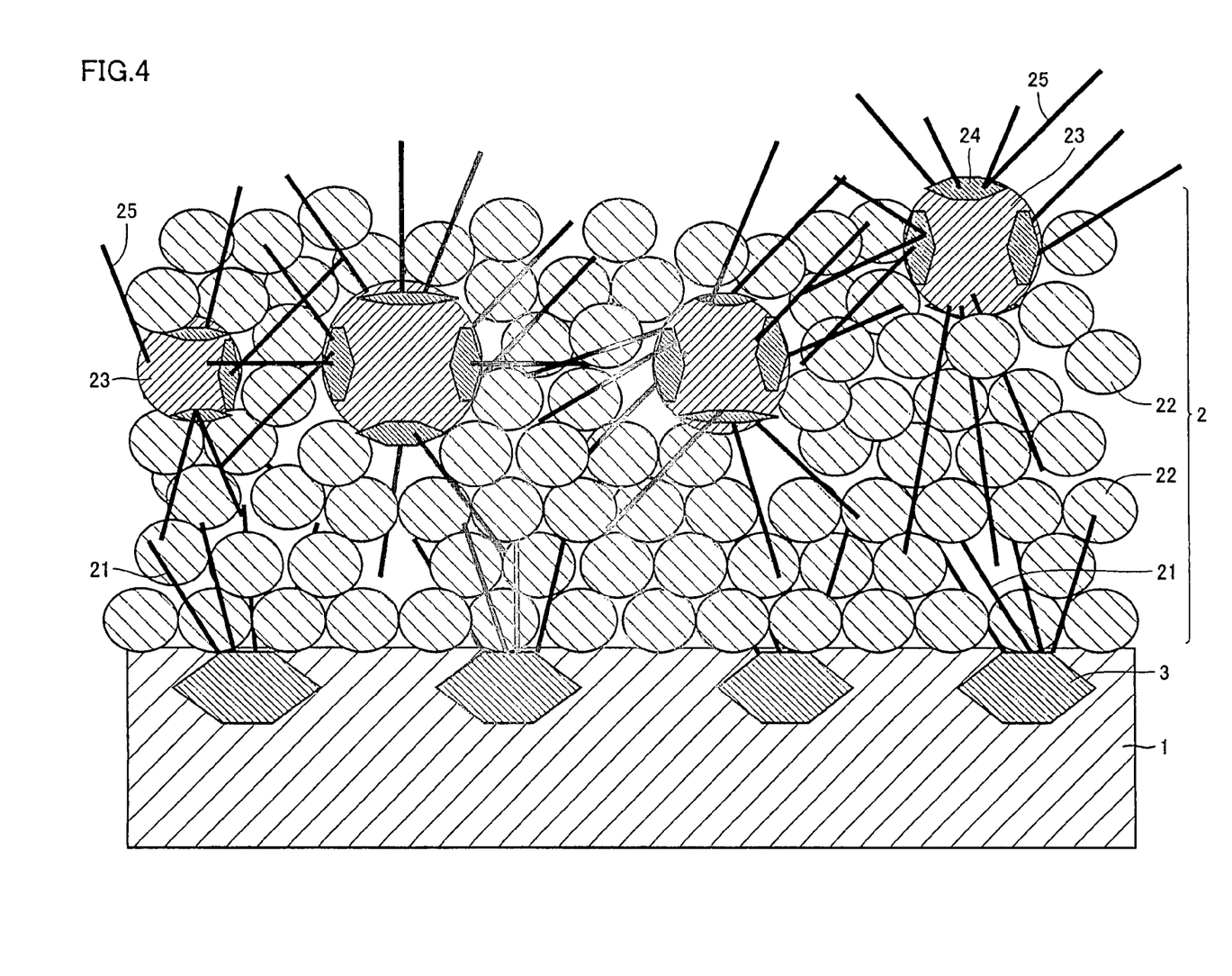
FIG. 4 is a typical view showing a sectional structure of an aluminum material coated with carbon as a yet another embodiment of this invention.

Also, as shown in FIG. 4, the sectional structure of the aluminum material coated with carbon as yet another embodiment of this invention has almost the same structure as the sectional structure shown in FIG. 1, wherein the carbon-containing layer 2 further includes a large number of carbon particles 22 and a large number of aluminum particles 23. The second surface portion 21 extends in a fibrous form or a filament form outward from the first surface portion 3, is formed between the first surface portion 3 and the carbon particles 22 and contains a carbide of aluminum. Moreover, an aluminum particle surface portion 24 is formed on at least a part of the surface of the aluminum particles 23 and contains a carbide of aluminum. An aluminum particle outside portion 25 is formed so as to extend in a cactus form outward the surface of the aluminum particles 23 from the aluminum particle surface portion 24 and contains a carbide of aluminum.

In one embodiment of this invention, no particular limitation is imposed on the type of aluminum material as a base material on which the carbon-containing layer is to be formed. As the aluminum material, pure aluminum or an aluminum alloy may be used. Such an aluminum material is preferably those having an aluminum purity of 98% by mass or more as a value measured according to the method described in "JIS H2111". The aluminum foil used in the present invention has compositions including aluminum alloys prepared by adding at least one alloy element among lead (Pb), silicon (Si), iron (Fe), copper (Cu), manganese (Mn), magnesium (Mg), chromium (Cr), zinc (Zn), titanium (Ti), vanadium (V), gallium (Ga), nickel (Ni) and boron (B) in an amount considered to be necessary, and aluminum limited in the amount of the above unavoidable impurity elements. Although no particular limitation is imposed on the thickness of the aluminum material, the thickness is preferably within a range between 5 μm or more and 200 μm or less in the case of a foil and in a range from 200 μm to 3 mm in the case of a plate.

As the above aluminum material, those manufactured by known methods may be used. For example, a molten bath of aluminum or an aluminum alloy having the above predetermined composition is prepared and cast to obtain an ingot, which is then homogenized properly. After that, this ingot is subjected to hot rolling and cold rolling to be able to obtain an aluminum material. In this case, the above ingot may be subjected to intermediate annealing treatment within a temperature range between 150° C. or more and 400° C. or less during the course of the above cold rolling step.

The aluminum material coated with carbon according to this invention is optimal for use as a gas electrode material of a fuel cell, a polar electrode material of an electric double layer capacitor and a cathode material of an electrolytic capacitor.

In the meantime, a material prepared by forming an active substance layer on the surface of an aluminum material used as a current collector layer has been used as a positive electrode material of lithium ion type secondary batteries such as a lithium ion battery and lithium ion polymer battery. As a negative electrode material, a material prepared by forming an active substance layer including a carbon-containing layer on a copper foil used as a current collector has been used. The aluminum material coated with carbon according to the present invention is also effective when it is used a current collector material to improve the adhesion of an electrode material (a mixture of metal acid lithium, carbon, a binder and the like) that is applied to the surface of a current collector in a positive electrode material of the above lithium ion type secondary batteries. In order to lighten these secondary batteries, an attempt has been made to use an aluminum material as a current collector in a negative electrode material. The aluminum material coated with carbon according to this invention is optimal for use as a negative electrode material of a lithium ion type secondary battery corresponding to such an attempt.

In one embodiment of the manufacturing method of an aluminum material coated with carbon according to this invention, no particular limitation is imposed on the kind of hydrocarbon-containing substance to be used. Examples of the kind of hydrocarbon-containing substance include paraffin-type hydrocarbons such as methane, ethane, propane, n-butane, isobutane and pentane, olefin-type hydrocarbons such as ethylene, propylene, butene and butadiene, acetylene-type hydrocarbons such as acetylene or derivatives of these hydrocarbons. Among these hydrocarbons, paraffin-type hydrocarbons such as methane, ethane and propane are gasified in the step of heating the aluminum foil and are therefore preferable. Any one of hydrocarbons such as methane, ethane and propane is more preferable. Methane in the hydrocarbons is most preferable.

Also, the hydrocarbon-containing substance may be used in any of a liquid state and a gas state in the manufacturing method according to this invention. It is only required for the hydrocarbon-containing substance to exist in a space where an aluminum material is present and any method may be used to introduce the hydrocarbon-containing substance into a space where an aluminum material is arranged. When the hydrocarbon-containing substance has a gas state (e.g., methane, ethane or propane), it may be filled either singly or in combination with an inert gas in a sealed space where an aluminum material is subjected to heat treatment. Also, when the hydrocarbon-containing substance has a liquid state, it may be filled either singly or in combination with inert gas in a manner that it is gasified in a sealed space.

There is no particular limitation to the pressure in a heating atmosphere in the step of heating an aluminum material and the heating may be carried out under normal pressure or reduced pressure or under pressure. Also, the pressure may be adjusted at any time when the atmosphere is kept at a constant temperature, when the atmosphere is raised to a prescribed temperature and when the atmosphere is dropped from a prescribed temperature.

Although no particular limitation is imposed on the weight ratio of the hydrocarbon-containing substance to be introduced in a space where an aluminum material is arranged, the weight ratio is preferably within a range between 0.1 parts by weight or more and 50 parts by weight or less, particularly preferably 0.5 parts by weight or more and 30 parts by weight or less, in terms of carbon with respect to 100 parts by weight of the aluminum material.

In the step of heating the aluminum material, the heating temperature is preferably within a range between 450° C. or more and less than 660° C., more preferably between 530° C. or more and 620° C. or less, though it may be properly set in accordance with the composition of the aluminum material to be heated. However, the manufacturing method according to this method does not exclude the case where the aluminum material is heated at a temperature less than 450° C. and it is only required for the aluminum material to be heated at a temperature at least exceeding 300° C.

The heating time is, though depending on, for example, heating temperature, generally within a range between 1 hour or more and 100 hours or less.

When the heating temperature is 400° C. or more, the concentration of oxygen in a heating atmosphere is preferably made to be 1.0% by volume or less. When the heating temperature is 400° C. or more and the concentration of oxygen in a heating atmosphere exceeds 1.0% by volume, a thermally oxidized film on the surface of the aluminum material is made large and there is therefore a fear that the boundary electric resistance at the surface of the aluminum material is increased.

Also, the surface of the aluminum material may be roughened prior to heat treatment. There is no particular limitation to the surface rouging method and known techniques such as washing, etching and blasting may be used.

When a thick carbon-containing layer is formed in the manufacturing method according to this invention, a process is adopted in which after a carbon-containing substance or a carbon-containing substance and an aluminum powder are adhered to the surface of the aluminum material, the aluminum material is arranged in a space containing a hydrocarbon-containing layer and heated. In this case, as the carbon-containing substance adhered to the surface of the aluminum foil, any of an active carbon fiber, active carbon cloth, active carbon felt, active carbon powder, Indian ink, carbon black and graphite may be used. As to the adhering method, the carbon-containing substance prepared in the form of a slurry, a liquid or a solid by using a binder, a solvent or water may be adhered onto the surface of the aluminum material by application, dipping or thermal and pressure bonding. After the carbon-containing substance is adhered onto the surface of the aluminum material, it may be dried within a temperature range between 20° C. or more and 300° C. or less.

In the case of adhering a carbon-containing substance and an aluminum powder to the surface of the aluminum material to form a thicker carbon-containing layer in the manufacturing method according to this invention, the aluminum powder may be added at a weight ratio within a range between 0.01 parts by weight or more and 10000 parts by weight or less with respect to 100 parts by weight of the above carbon-containing substance.

EXAMPLES

Aluminum materials coated with carbon were fabricated in accordance with Examples 1 to 23 and Conventional Examples 1 to 3. For comparison with the examples, reference examples of an aluminum material coated with carbon were fabricated.

Examples 1 to 5

A carbon-containing substance was applied to both surfaces of an aluminum hard foil having a thickness of 10 µm (JIS A1050-H18) and dried at 30° C. for 3 hours to adhere the carbon-containing substance to the foil. The nominal purity of the aluminum foil was 99.55% by mass and mass analysis of the composition of the aluminum foil showed that the amounts of silicon and iron were 2250 ppm and 3800 ppm, respectively. The composition of the carbon-containing substance was as follows: 1 part by weight of carbon black (trade name: #2400B, made by Mitsubishi Chemical Corporation) to which 6 parts by weight of isopropyl alcohol (IPA) and 3 parts by weight of 1,1,1 trichloroethane were added. The carbon-containing substance was adhered such that the dry thickness of the layer formed on one surface was 4 µm.

After that, the aluminum foil to which the carbon-containing substance was adhered was heated for 12 hours in the atmospheric and temperature condition as shown in Table 1.

Example 6

A carbon-containing substance was applied to both surfaces of an aluminum hard foil having a thickness of 10 µm (JIS A1050-H18) and dried at 100° C. for 10 minutes to adhere the carbon-containing substance to the foil. The nominal purity of the aluminum foil was 99.55% by mass and mass analysis of the composition of the aluminum foil showed that the amounts of silicon and iron were 2250 ppm and 3800 ppm, respectively. The composition of the carbon-containing substance was as follows: 1 part by weight of carbon black (trade name: #2400B, made by Mitsubishi Chemical Corporation) to which 1 part by weight of polyethylene terephthalate (PET) was added. The carbon-containing substance was adhered such that the dry thickness of the layer formed on one surface was 180 µm.

After that, the aluminum foil to which the carbon-containing substance was adhered was heated for 12 hours in the atmospheric and temperature condition as shown in Table 1.

Example 7

A carbon-containing substance was adhered to both surfaces of an aluminum hard foil in the same manner as in Example 6. Thereafter, the aluminum foil to which the carbon-containing substance was adhered was rolled using a rolling mill at a reduction ratio of about 20% to bind the carbon-containing substance to the surface of the aluminum foil under pressure. The aluminum foil to which the carbon-containing substance was bound under pressure was heated for 12 hours in the atmospheric and temperature condition as shown in Table 1.

Example 8

A carbon-containing substance was applied to both surfaces of an aluminum hard foil having a thickness of 10 µm (JIS A3003-H18) and dried at 100° C. for 10 minutes to adhere the carbon-containing substance to the foil. The results of mass analysis of the composition of the aluminum foil were as follows: silicon: 0.57% by mass, iron: 0.62% by mass, copper: 0.1% by mass and manganese: 1.1% by mass. The composition of the carbon-containing substance was as follows: 1 part by weight of carbon black (trade name: #2400B, made by Mitsubishi Chemical Corporation) to which 1 part by weight of polyethylene terephthalate (PET) was added. The carbon-containing substance was adhered such that the dry thickness of the layer formed on one surface was 3 mm.

Thereafter, the aluminum foil to which the carbon-containing substance was adhered was rolled using a rolling mill at a reduction ratio of about 30% to bind the carbon-containing substance to the surface of the aluminum foil under pressure. The aluminum foil to which the carbon-containing substance was bound under pressure was heated for 12 hours in the atmospheric and temperature condition as shown in Table 1.

Examples 9 to 12

A carbon-containing substance was applied to both surfaces of an aluminum hard foil having a thickness of 10 μm (JIS A3003-H18) and dried at 100° C. for 10 minutes to adhere the carbon-containing substance to the foil. The results of mass analysis of the composition of the aluminum foil were as follows: silicon: 0.57% by mass, iron: 0.62% by mass, copper: 0.1% by mass and manganese: 1.1% by mass. The composition of the carbon-containing substance was as follows: 100 parts by weight of carbon black (trade name: #2400B, made by Mitsubishi Chemical Corporation) to which 100 parts by weight of polyethylene terephthalate (PET) and an aluminum powder in the amount shown in Table 1 were added. The carbon-containing substance was adhered such that the dry thickness of the layer formed on one surface was 3 mm.

Thereafter, the aluminum foil to which the carbon-containing substance was adhered was rolled using a rolling mill at a reduction ratio of about 30% to bind the carbon-containing substance to the aluminum foil under pressure. The aluminum foil to which the carbon-containing substance was bound under pressure was heated for 12 hours in the atmospheric and temperature condition as shown in Table 1.

Conventional Example 1

A carbon-containing substance was applied to both surfaces of an aluminum hard foil having a thickness of 10 μm (JIS A1050-H18) and dried at 30° C. for 3 hours to adhere the carbon-containing substance to the foil. The nominal purity of the aluminum foil was 99.55% by mass and mass analysis of the composition of the aluminum foil showed that the amounts of silicon and iron were 2250 ppm and 3800 ppm, respectively. The composition of the carbon-containing substance was as follows: 1 part by weight of carbon black (trade name: #2400B, made by Mitsubishi Chemical Corporation) to which 6 parts by weight of isopropyl alcohol (IPA) and 3 parts by weight of 1,1,1 trichloroethane were added. The carbon-containing substance was adhered such that the dry thickness of the layer formed on one surface was 4 μm.

The aluminum foil coated with carbon which was obtained in this manner corresponds to those which were not heat-treated in Examples 1 to 5.

Conventional Example 2

A carbon-containing substance was applied to both surfaces of an aluminum hard foil having a thickness of 10 μm (JIS A1050-H18) and dried at 100° C. for 10 minutes to adhere the carbon-containing substance to the foil. The nominal purity of the aluminum foil was 99.55% by mass and mass analysis of the composition of the aluminum foil showed that the amounts of silicon and iron were 2250 ppm and 3800 ppm, respectively. The composition of the carbon-containing substance was as follows: 1 part by weight of carbon black (trade name: #2400B, made by Mitsubishi Chemical Corporation) to which 1 part by weight of polyethylene terephthalate (PET) was added. The carbon-containing substance was adhered such that the dry thickness of the layer formed on one surface was 180 μm.

The aluminum foil coated with carbon which was obtained in this manner corresponds to one which was not heat-treated in Example 6.

Conventional Example 3

A carbon-containing substance was applied to both surfaces of an aluminum hard foil having a thickness of 10 μm (JIS A3003-H18) and dried at 100° C. for 10 minutes to adhere the carbon-containing substance to the foil. The results of mass analysis of the composition of the aluminum foil were as follows: silicon: 0.57% by mass, iron: 0.62% by mass, copper: 0.1% by mass and manganese: 1.1% by mass. The composition of the carbon-containing substance was as follows: 1 part by weight of carbon black (trade name: #2400B, made by Mitsubishi Chemical Corporation) to which 1 part by weight of polyethylene terephthalate (PET) was added. The carbon-containing substance was adhered such that the dry thickness of the layer formed on one surface was 3 mm.

The aluminum foil coated with carbon which was obtained in this manner corresponds to one which was not heat-treated in Example 7.

Reference Example 1

A carbon-containing substance was applied to both surfaces of an aluminum hard foil having a thickness of 10 μm (JIS A1050-H18) and dried at 30° C. for 3 hours to adhere the carbon-containing substance to the foil. The nominal purity of the aluminum foil was 99.55% by mass and mass analysis of the composition of the aluminum foil showed that the amounts of silicon and iron were 2250 ppm and 3800 ppm, respectively. The composition of the carbon-containing substance was as follows: 1 part by weight of carbon black (trade name: #2400B, made by Mitsubishi Chemical Corporation) to which 6 parts by weight of isopropyl alcohol (IPA) and 3 parts by weight of 1,1,1 trichloroethane were added. The carbon-containing substance was adhered such that the dry thickness of the layer formed on one surface was 4 μm.

After that, the aluminum foil to which the carbon-containing substance was adhered was heated for 12 hours in the atmospheric and temperature condition as shown in Table 1.

With respect to the aluminum materials coated with carbon obtained in Examples 1 to 12, Conventional Examples 1 to 3 and Reference Example 1, evaluations were made for the adhesion between the carbon-containing layer and the aluminum material, the formation amount of the interposition layer containing an aluminum element and a carbon element and the formation amount of interposition materials contained in the carbon-containing layer. The evaluation conditions are as follows. The evaluation results are shown in Table 1.

(Adhesion)

The adhesion was evaluated by a taping method. A pressure-sensitive adhesive tape (trade name: "Scotch Tape", made by Sumitomo 3M Ltd.) having a 15-mm-wide and 120-mm-long adhesive surface was pressed against the surface of a carbon-containing layer in a 10-mm-wide and 100-mm-long sample of the aluminum material coated with carbon and then the removable adhesive tape was peeled off to evaluate the adhesion according to the following equation.

Adhesion (%)={weight (mg) of carbon-containing layer after peeled/weight (mg) of carbon-containing layer before peeled}×100 (Formation amounts of interposition layer and interposition material)

The formation amounts of the interposition layer and interposition materials were evaluated by quantitative analysis of aluminum carbides. The gas generated by the sample of the aluminum material coated with carbon was all dissolved in an aqueous 20% sodium hydroxide solution was collected and quantitatively analyzed by using a high sensitivity gas chromatograph equipped with a flame ion detector and the detected content was converted into the content of aluminum carbide ($Al_4C_3$). Based on this aluminum carbide content, the formation amounts of the interposition layer and interposition materials were evaluated according to the following equation.

Formation amount of the interposition layer and interposition materials=weight of aluminum carbides ($Al_4C_3$)/carbon-containing layer (mg).

Example 2. Also in the case of forming a thicker carbon-containing layer, the aluminum materials coated with carbon which were obtained in Examples 8 and 12 exhibited considerably higher adhesion than the aluminum material of Conventional Example 3. In this case, it is understood that the aluminum materials coated with carbon in Examples 9 to 12 which were obtained by heat-treating after, in addition to the carbon-containing substance, an aluminum powder was adhered to the foil exhibited higher adhesion than the aluminum material coated with carbon in Example 8 which was obtained by heat-treating after only the carbon-containing substance was adhered to the foil.

The aluminum material coated with carbon which was obtained in Reference Example 1 by carrying out heat treatment in an atmosphere of argon gas which was inert gas used in place of the atmospheric gases containing the hydrocarbon-containing substance (Examples 1 to 5) exhibited lower adhesion like the Conventional Example 1.

Though, in the above examples, the cases where a carbon-containing substance is adhered to the surface of an aluminum material, followed by carrying out heat treatment are shown, it was confirmed that even samples obtained when a carbon-containing substance is not adhered to the surface of an aluminum material in advance exhibited higher adhesion than those currently in use.

When the surface of the sample obtained in Example 5 was observed by a scanning electron microscope (SEM), the existence of a portion extending outward from the surface of the aluminum foil in a fibrous form or a filament form about 1000 nm in length as the carbon-containing layer was confirmed. A typical sectional view of Example 5 is shown

TABLE 1

| | Heating atmosphere | Heating temperature (° C.) | Adhesion (%) | Formation amounts of interposition layer and interposition material | Amount of aluminum powder (parts by weight) |
|---|---|---|---|---|---|
| Example 1 | Acetylene gas | 430 | 78 | 540 | — |
| Example 2 | Methane gas | 470 | 82 | 1010 | — |
| Example 3 | Methane gas | 540 | 87 | 1350 | — |
| Example 4 | Methane gas | 580 | 93 | 8780 | — |
| Example 5 | Methane gas | 620 | 98 | 13500 | — |
| Example 6 | Methane gas | 580 | 92 | 190 | — |
| Example 7 | Methane gas | 580 | 96 | 210 | — |
| Example 8 | Methane gas | 580 | 77 | 12 | — |
| Example 9 | Methane gas | 580 | 82 | 13 | 0.05 |
| Example 10 | Methane gas | 580 | 91 | 22 | 5 |
| Example 11 | Methane gas | 580 | 97 | 48 | 500 |
| Example 12 | Methane gas | 580 | 93 | 600 | 50000 |
| Conventional Example 1 | — | — | 5 | Tr | — |
| Conventional Example 2 | — | — | 10 | Tr | — |
| Conventional Example 3 | — | — | 3 | Tr | — |
| Reference Example 1 | Argon gas | 580 | 6 | Tr | — |

In Table 1, the term "Tr" shown in the column named "formation amounts of interposition layer and interposition material" shows that the amount are so small that it cannot be detected.

As is clear from the results of Table 1, the aluminum materials coated with carbon which were obtained in Examples 1 to 5 exhibited considerably higher adhesion than the aluminum material of Conventional Example 1. Also in the case of forming a thick carbon-containing layer, the aluminum materials coated with carbon which were obtained in Examples 6 and 7 exhibited considerably higher adhesion than the aluminum material of Conventional in FIG. 2. Also, the presence of aluminum carbide was confirmed by X-ray analysis and an electron energy loss spectrometer (EELS).

When the surface of the sample obtained in Example 10 was observed by a scanning electron microscope (SEM), the existence of a carbon-containing layer was confirmed, the carbon-containing layer being constituted of a portion extending outward in a cactus form from a large number of particle portions having a particle diameter of about 1 μm which particle portions are adhered onto the surface of the aluminum foil and a large number of particle portions having a particle diameter of about 0.1 μm which particle portions are adhered onto the above portion. The typical sectional view of Example 10 is shown in FIG. 4. Also, the presence of aluminum carbide was confirmed by X-ray analysis and an electron energy loss spectrometer (EELS).

Reference Example 2

An aluminum foil having a thickness of 30 μm (JIS A1050-H18) was kept at 590° C. for 10 hours in an argon gas atmosphere. After that, the surface of the sample was observed by a scanning electron microscope (SEM). As a result, the existence of a portion extending outward from the surface of the aluminum foil in a fibrous form or a filament form was not confirmed. Also, the presence of aluminum carbide was not confirmed by X-ray analysis and an electron energy loss spectrometer (EELS).

Example 13

An aluminum foil having a thickness of 30 μm (JIS A1050-H18) was kept at 590° C. for 10 hours in an acetylene gas atmosphere. Thereafter, the surface of the sample was observed by a scanning electron microscope (SEM), to confirm the existence of a portion extending outward from the surface of the aluminum foil in a fibrous form or a filament form about 1000 nm in length as the carbon-containing layer. FIG. 1 is a typical sectional view of the above portion. Also, the presence of aluminum carbide was confirmed by X-ray analysis and an electron energy loss spectrometer (EELS).

Reference Example 3

An aluminum material having a thickness of 40 μm (JIS A1080-H18) was subjected to a.c. etching treatment carried out in an electrolytic solution containing 15% of hydrochloric acid and 0.5% of sulfuric acid in the condition of a temperature of 50° C. and a current density of 0.4 A/cm$^2$ for 60 seconds and then, the etched aluminum material was washed with water and dried.

Reference Example 4

The etched aluminum material obtained in Reference Example 3 was kept at 590° C. for 10 hours in an argon gas atmosphere.

Example 14

The etched aluminum material obtained in Reference Example 3 was kept at 590° C. for 10 hours in an acetylene gas atmosphere.

Example 15

2 Parts by weight of carbon black having an average particle diameter of 0.5 μm was mixed with 1 part by weight of a binder containing at least carbon and hydrogen and the mixture was dispersed in a solvent (toluene) to obtain a coating solution having a solid content of 30%. This coating solution was applied to both surfaces of an aluminum material having a thickness of 30 μm (JIS A1050-H18) and dried. The dry thickness of the coating layer formed on one surface was 1 μm. This aluminum material was kept at 590° C. for 10 hours in a methane gas atmosphere. Then, when the surface of the sample was observed by a scanning electron microscope (SEM), the existence of a carbon-containing layer was confirmed, the carbon-containing layer being constituted of a portion extending outward in a fibrous form or a filament form about 1000 nm in length from the surface of the aluminum material and a large number of particle portions having a particle diameter of about 0.5 μm which particle portions are adhered to the above extended portion. The typical sectional view of this carbon-containing layer is shown in FIG. 2. Also, the presence of aluminum carbide was confirmed by X-ray analysis and an electron energy loss spectrometer (EELS).

Example 16

2 Parts by weight of an aluminum powder having an average particle diameter of 1 μm was mixed with 1 part by weight of a binder containing at least carbon and hydrogen and the mixture was dispersed in a solvent (toluene) to obtain a coating solution containing a solid content of 30%. This coating solution was applied to both surfaces of an aluminum material having a thickness of 15 μm (JIS 1N30-H18) and dried. The dry thickness of the coating layer formed on one surface was 2 μm. This aluminum material was kept at 620° C. for 10 hours in a methane gas atmosphere. Then, when the surface of the sample was observed by a scanning electron microscope (SEM), the existence of a portion extending outward in a cactus form about 5000 nm in length from a large number of particle portions having a particle diameter of about 1 μm which particle portions were adhered to the aluminum material as a carbon-containing layer was confirmed. The typical sectional view of this carbon-containing layer is shown in FIG. 3. Also, the presence of aluminum carbide was confirmed by X-ray analysis and an electron energy loss spectrometer (EELS).

Examples 17 to 23

2 Parts by weight of carbon black having an average particle diameter of 0.1 μm and 2 parts by weight of an aluminum powder having an average particle diameter of 1 μm were mixed with 1 part by weight of a binder containing at least carbon and hydrogen and the mixture was dispersed in a solvent (toluene) to obtain a coating solution having a solid content of 30%. This coating solution was applied to both surfaces of an aluminum material having a thickness of 1.5 mm (JIS A3003-H18) and dried. The dry thickness of the coating layer formed on one surface was 4 μm. This aluminum material was subjected to heat treatment in the conditions shown in Table 2. In Example 21, the aluminum material was rolled using a rolling mill at a reduction ratio of about 30% after the heat treatment. In Example 23, the aluminum material was subjected to activating treatment carried out at 300° C. for 2 hours in air after the heat treatment. Then, when the surface of the sample was observed by a scanning electron microscope (SEM), the existence of a carbon-containing layer was confirmed, the carbon-containing layer being constituted of a portion extending outward in a cactus form from a large number of particle portions having a particle diameter of about 1 μm and adhered onto the surface of the aluminum material and a large number of particle portions having a particle diameter of about 0.1 μm which particle portions are adhered onto the above extended portion. The typical sectional view of this carbon-containing layer is shown in FIG. 4.

TABLE 2

|  | Atmosphere | Temperature (° C.) | Time (Hr) |
|---|---|---|---|
| Example 17 | Acetylene gas | 440 | 60 |
| Example 18 | Acetylene-hydrogen mixed gas | 490 | 10 |
| Example 19 | Methane gas | 540 | 10 |
| Example 20 | Methane-hydrogen mixed gas | 590 | 10 |
| Example 21 | Methane-argon mixed gas | 590 | 10 |
| Example 22 | Methane gas | 640 | 10 |
| Example 23 | Methane gas | 540 | 10 |

With respect to the aluminum materials coated with carbon which were obtained in Examples 13 and 14 and the aluminum materials obtained in Reference Examples 2 to 4, evaluation was made for the surface resistance characteristics. The evaluation conditions are as shown below. The evaluation results are shown in Table 3.

(Surface Resistance Characteristics)

The surface resistance characteristics were evaluated by an a.c. impedance method.

Each of the samples obtained in Examples 13 and 14 and Reference Examples 2 to 4 was dipped in an aqueous 1 M hydrochloric acid solution kept at a temperature of 293 K to measure a.c. impedance under a constant current. The impedance was measured at 20 frequencies ranging from 0.5 to 1000 Hz. Generally, the simplest equivalent circuit at the boundary of an electrode/aqueous solution is represented by a circuit in which a solution resistance is connected in series to a parallel circuit of a charge transfer resistance and an electric double layer capacitor. In light of this, the a.c. impedances measured in this condition were expressed as vectors on a complex plane where the X axis was a real part and the Y axis was an imaginary part. Also, the value at the point of intersection with the X axis was found from the locus of a.c. impedance of each sample to adopt it as surface resistance.

TABLE 3

|  | Surface resistance (Ω) |
|---|---|
| Example 13 | 36 |
| Reference Example 2 | 947 |
| Example 14 | 27 |
| Reference Example 3 | 59 |
| Reference Example 4 | 214 |

As is clear from the results of Table 3, the aluminum material coated with carbon which was obtained in Example 13 exhibited considerably lower surface resistance characteristics than the aluminum material of Reference Example 2. Also in the case of an aluminum material whose surface had been etched, the aluminum coated with carbon which was obtained in Example 14 exhibited considerably lower surface resistance characteristics than the aluminum material of Reference Example 3 or 4.

With respect to the aluminum materials coated with carbon which were obtained in Examples 13 to 23 and the aluminum materials obtained in Reference Examples 2 to 4, evaluation was made for the surface area. The evaluation conditions are as shown below. The evaluation results are shown in Table 4.

(Surface Area)

The surface area was evaluated by means of capacitance. The capacitance was measured in an aqueous ammonium borate solution (8 g/L) by a LCR meter.

TABLE 4

|  | Capacitance ($\mu F/cm^2$) |
|---|---|
| Example 13 | 50 |
| Reference Example 2 | 4 |
| Example 14 | 70 |
| Reference Example 3 | 30 |
| Reference Example 4 | 30 |
| Example 15 | 160 |
| Example 16 | 480 |
| Example 17 | 500 |
| Example 18 | 510 |
| Example 19 | 700 |
| Example 20 | 680 |
| Example 21 | 600 |
| Example 22 | 980 |
| Example 23 | 2000 |

As is clear from the results shown in Table 4, the aluminum material coated with carbon which was obtained in Example 13 exhibited a considerably higher capacitance, namely, a considerably higher surface area, than the aluminum material of Reference Example 2. Also in the case of an aluminum material whose surface was etched, the aluminum material coated with carbon which was obtained in Example 14 exhibited a considerably larger surface area than the aluminum materials of Reference Examples 3 and 4. Furthermore, the aluminum materials coated with carbon which were obtained in Examples 15 to 21 exhibited a considerably larger surface area than the aluminum material of Reference Examples 3 and 4 whose surface was etched.

The above disclosed embodiments and examples are illustrative in all points and are not to be considered to be restrictive. The scope of the present invention is defined by the appended claims rather than by the above embodiments and examples and all variations and modifications within the scope of the claims and within the meaning of equivalence are involved.

INDUSTRIAL APPLICABILITY

The charging/discharging characteristics, capacity and life of a battery or a capacitor can be improved by constituting an electrode structure using an aluminum material coated with carbon according to this invention.

The invention claimed is:

1. An aluminum material coated with carbon, comprising:
an aluminum material; and
a carbon-containing layer formed on a surface of said aluminum material, the aluminum material further comprising:
an interposition layer that is formed between said aluminum material and said carbon-containing layer and contains an aluminum element and a carbon element,
wherein said carbon-containing layer is formed so as to extend outward from the surface of said aluminum material.

2. The aluminum material coated with carbon according to claim 1, wherein said carbon-containing layer includes therein an interposition material containing an aluminum element and a carbon element.

3. The aluminum material coated with carbon according to claim 2, wherein said interposition material is a compound of an aluminum element and a carbon element.

4. The aluminum material coated with carbon according to claim 1, wherein said carbon-containing layer is a compound of an aluminum element and a carbon element.

5. The aluminum material coated with carbon according to claim 1, wherein a ratio of a thickness of said carbon-containing layer is within a range between 0.1 or more and 1000 or less with respect to a thickness of said aluminum material.

6. The aluminum material coated with carbon according to claim 1, which is used to constitute an electrode structure.

7. The aluminum material coated with carbon according to claim 6, wherein said electrode structure is any one selected from the group consisting of an electrode and an electrode current collector.

8. The aluminum material coated with carbon according to claim 6, wherein said electrode structure is used to constitute a capacitor.

9. The aluminum material coated with carbon according to claim 8, wherein said capacitor is any one selected from an electrochemical capacitor and an electrolytic capacitor.

10. The aluminum material coated with carbon according to claim 6, wherein said electrode structure is used to constitute a battery.

11. An aluminum material coated with carbon, comprising:
   an aluminum material; and
   a carbon-containing layer formed on a surface of said aluminum material, the aluminum material further comprising:
   an interposition layer that is formed between said aluminum material and said carbon-containing layer and contains an aluminum element and a carbon element,
   wherein said interposition layer includes a first surface portion that is formed on at least a part of the surface of said aluminum material and contains a carbide of aluminum, and said carbon-containing layer includes a second surface portion that is formed so as to extend outward from said first surface portion.

12. The aluminum material coated with carbon according to claim 11, wherein said carbon-containing layer further includes carbon particles, and said second surface portion is formed between said first surface portion and said carbon particles and contains a carbide of aluminum.

13. The aluminum material coated with carbon according to claim 12, wherein said carbon-containing layer further includes aluminum particles, an aluminum particle surface portion that is formed on at least a part of the surface of said aluminum particles and contains a carbide of aluminum, and an aluminum particle outside portion that is formed so as to extend outward the surface of said aluminum particles from the aluminum particle surface portion and contains a carbide of aluminum.

14. The aluminum material coated with carbon according to claim 11, wherein said carbon-containing layer further includes aluminum particles, an aluminum particle surface portion that is formed on at least a part of the surface of said aluminum particles and contains a carbide of aluminum, and an aluminum particle outside portion that is formed so as to extend outward of the surface of said aluminum particles from the aluminum particle surface portion and contains a carbide of aluminum, and said second surface portion is formed between said first surface portion and said aluminum particles and contains a carbide of aluminum.

15. A manufacturing method of an aluminum material coated with carbon, comprising the steps of:
   arranging an aluminum material in a sealed space which is filled solely with a hydrocarbon-containing substance; and
   heating in the state where the aluminum material is arranged in the sealed space which is filled solely with the hydrocarbon-containing substance,
   wherein said step of arranging the aluminum material in the sealed space which is filled solely with the hydrocarbon-containing substance involves adhering at least one kind selected from the group consisting of a carbon-containing substance and an aluminum powder to the surface of the aluminum material and, then, arranging the aluminum material in the sealed space which is filled solely with the hydrocarbon-containing substance.

16. The manufacturing method of an aluminum material coated with carbon according to claim 15, further comprising the step of cooling and reheating the aluminum material after said step of heating in the state where the aluminum material is arranged in the sealed space containing the hydrocarbon-containing substance.

17. The manufacturing method of an aluminum material coated with carbon according to claim 16, wherein said step of cooling and reheating the aluminum material is carried out within a temperature range between 100° C. or more and less than 660° C.

18. The manufacturing method of an aluminum material coated with carbon according to claim 15, wherein said step of heating in the state where the aluminum material is arranged in the sealed space containing the hydrocarbon-containing substance is carried out within a temperature range between 450° C. or more and less than 660° C.

19. The manufacturing method of an aluminum material coated with carbon according to claim 15, wherein said step of arranging the aluminum material in the sealed space containing the hydrocarbon-containing substance involves arranging the aluminum material in a space containing a paraffin-type hydrocarbon.

20. The manufacturing method of an aluminum material coated with carbon according to claim 15, wherein said step of arranging the aluminum material in the sealed space containing the hydrocarbon-containing substance involves arranging the aluminum material in a space containing methane.

* * * * *